(12) United States Patent
Nam

(10) Patent No.: US 8,664,693 B2
(45) Date of Patent: Mar. 4, 2014

(54) LIGHT EMITTING DIODE HAVING ALGAN BUFFER LAYER AND METHOD OF FABRICATING THE SAME

(75) Inventor: Ki Bum Nam, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 224 days.

(21) Appl. No.: 12/090,047

(22) PCT Filed: Mar. 9, 2007

(86) PCT No.: PCT/KR2007/001171
§ 371 (c)(1),
(2), (4) Date: May 8, 2008

(87) PCT Pub. No.: WO2007/105882
PCT Pub. Date: Sep. 20, 2007

(65) Prior Publication Data
US 2009/0032833 A1   Feb. 5, 2009

(30) Foreign Application Priority Data
Mar. 13, 2006   (KR) .................. 10-2006-0023196

(51) Int. Cl.
*H01L 21/02* (2006.01)
(52) U.S. Cl.
USPC ............. 257/190; 257/E33.028; 257/E33.033
(58) Field of Classification Search
USPC ............. 257/190, E33.025–E33.028
See application file for complete search history.

(56) References Cited

U.S. PATENT DOCUMENTS 6,534,800 B1   3/2003   Ohbo et al.
(Continued)

FOREIGN PATENT DOCUMENTS

DE   101 42 653   4/2003
JP   10-093140   4/1998
(Continued)

OTHER PUBLICATIONS

Machine Translation of JP-2000021297 to Futahashi generated from Japanese Patent Office website.*

(Continued)

*Primary Examiner* — Thao Le
*Assistant Examiner* — Allen Parker
(74) *Attorney, Agent, or Firm* — H.C. Park & Associates, PLC

(57) ABSTRACT

The present invention relates to a light emitting diode having an $Al_xGa_{1-x}N$ buffer layer and a method of fabricating the same, and more particularly, to a light emitting diode having an $Al_xGa_{1-x}N$ buffer layer, wherein between a substrate and a GaN-based semiconductor layer, the Al x Ga 1-x N ($0 \le x \le 1$) buffer layer having the composition ratio x of Al decreasing from the substrate to the GaN-based semiconductor layer is interposed to reduce lattice mismatch between the substrate and the GaN-based semiconductor layer, and a method of fabricating the same. To this end, the present invention provides a light emitting diode comprising a substrate; a first conductive semiconductor layer positioned on the substrate; and an $Al_xGa_{1-x}N$ ($0 \le x \le 1$) buffer layer interposed between the substrate and the first conductive semiconductor layer and having a composition ratio x of Al decreasing from the substrate to the first conductive semiconductor layer.

10 Claims, 2 Drawing Sheets

(56) References Cited

U.S. PATENT DOCUMENTS

| | | |
|---|---|---|
| 2002/0017648 A1* | 2/2002 | Kasahara et al. ............... 257/79 |
| 2002/0020850 A1 | 2/2002 | Shibata et al. |
| 2002/0027236 A1* | 3/2002 | Uenoyama et al. ........... 257/256 |
| 2002/0074552 A1* | 6/2002 | Weeks et al. .................... 257/76 |
| 2003/0057434 A1* | 3/2003 | Hata et al. ..................... 257/103 |
| 2004/0026978 A1 | 2/2004 | Kim |
| 2004/0155250 A1* | 8/2004 | Ohba ............................... 257/79 |
| 2006/0180831 A1* | 8/2006 | Nakazawa et al. ............ 257/189 |
| 2007/0290230 A1* | 12/2007 | Kawaguchi et al. .......... 257/196 |

FOREIGN PATENT DOCUMENTS

| | | | |
|---|---|---|---|
| JP | 2000021297 A * | 1/2000 | ............... H01J 1/34 |
| JP | 2001-230447 | 8/2001 | |
| JP | 2002-118282 | 4/2002 | |
| JP | 2003-158294 | 5/2003 | |
| KR | 10-2000-0074448 | 12/2000 | |

OTHER PUBLICATIONS

Office Action issued Apr. 28, 2010 by the German Patent and Trademark Office in German Patent Application No. 11 2007 000 060.0-33.

Final Office Action of U.S. Appl. No. 12/571,981 issued on Nov. 10, 2010.

Notice of Allowance of Apr. 11, 2011 in U.S. Appl. No. 12/571,981.

* cited by examiner

LIGHT EMITTING DIODE HAVING ALGAN BUFFER LAYER AND METHOD OF FABRICATING THE SAME

CROSS REFERENCE RELATED APPLICATIONS

This application is the National Stage of International Application No. PCT/KR2007/001171, filed on Mar. 9, 2007, and claims priority from and the benefit of Korean Patent Application No. 10-2006-0023196, filed on Mar. 13, 2006, which are both hereby incorporated by reference for all purposes as if fully set forth herein.

BACKGROUND OF THE INVENTION

1. Field of the Invention

The present invention relates to a light emitting diode having an $Al_xGa_{1-x}N$ buffer layer and a method of fabricating the same, and more particularly, to a light emitting diode having an $Al_xGa_{1-x}N$ buffer layer, wherein between a substrate and a first conductive semiconductor layer, the $Al_xGa_{1-x}N$ ($0 \le x \le 1$) buffer layer having the composition ratio x of Al decreasing from the substrate to the first conductive semiconductor layer is interposed to reduce lattice mismatch between the substrate and the first conductive semiconductor layer, and a method of fabricating the same.

2. Discussion of the Background

A light emitting diode (LED) is a photoelectric conversion semiconductor device having a structure in which an N-type semiconductor and a P-type semiconductor are joined to each other, and emits light by recombination of electrons and holes. The LED has been widely used as a display device and a backlight. Further, since the LED has lower power consumption and longer lifespan as compared with bulbs or fluorescent lamps, the applications of the LED are expanded to general illumination while substituting for incandescent lamps and fluorescent lamps.

In a light emitting diode, a sapphire substrate having good stability has been generally used as a substrate that serves as a base of the light emitting diode. An $Al_xIn_yGa_{1-x-y}N$ semiconductor layer ($0 \le x,y,x+y \le 1$), i.e., a GaN-based semiconductor layer, is grown on the substrate. Particularly, in case of green and blue light emitting diodes, there are many light emitting diodes using the GaN-based semiconductor layer having a higher band gap.

However, the GaN-based semiconductor layer grown on the sapphire substrate has a problem in that it has a higher defect density due to lattice mismatch between the GaN-based semiconductor layer and the sapphire substrate, resulting in problems of deterioration of the reliability, productivity and electrical properties of the light emitting diode.

In order to solve these problems, a conventional light emitting diode has been fabricated by using a method in which a GaN buffer layer is grown on a sapphire substrate and a doped GaN-based conductive semiconductor layer is then grown on the GaN buffer layer.

SUMMARY OF THE INVENTION

However, the conventional light emitting diode has problems in that the GaN-based buffer layer has a higher defect density due to a difference in lattice constant between the sapphire substrate and the GaN-based buffer layer grown on the sapphire substrate, and the doped GaN-based conductive semiconductor layer grown on the GaN-based buffer layer also has a higher defect density due to high stress.

The present invention is conceived to solve the aforementioned problems. Accordingly, an object of the present invention is to lower a defect density of a light emitting diode by reducing lattice mismatch between a substrate and a GaN-based semiconductor layer.

Another object of the present invention is to allow growth of a GaN-based semiconductor layer having desirable crystallinity, surface configuration and electrical properties.

According to an aspect of the present invention for achieving the object, there is provided a light emitting diode comprising a substrate; a first conductive semiconductor layer positioned on the substrate; and an $AlxGa1-xN$ ($0 \le x \le 1$) buffer layer interposed between the substrate and the first conductive semiconductor layer and having a composition ratio x of Al decreasing from the substrate to the first conductive semiconductor layer.

The composition ratio of Al may decrease in a linear manner.

The composition ratio of Al may decrease in a stepwise manner.

The composition ratio of Al may decrease in a declined stepwise manner.

A portion of the AlxGa1-xN buffer layer having the composition ratio of Al equal to 1 may have a thickness of about 1 nm to about 50 nm.

A portion of the AlxGa1-xN buffer layer having the composition ratio of Al equal to 0 may have a thickness of about 1 nm to about 50 nm.

Each of portions of the AlxGa1-xN buffer layer having a constant composition ratio of Al other than 1 and 0 may have a thickness of about 1 nm to about 30 nm.

According to another aspect of the present invention for achieving the object, there is provided a method of fabricating a light emitting diode, comprising the steps of preparing a substrate; forming an AlxGa1-xN ($0 \le x \le 1$) buffer layer on the substrate, the buffer layer having a composition ratio of Al decreasing toward a surface thereof, and forming a GaN-based semiconductor layer on the AlxGa1-xN buffer layer.

The composition of Al may decrease in a linear manner.

The composition ratio of Al may decrease in a stepwise manner.

The composition of Al may decrease in a declined stepwise manner.

The AlxGa1-xN buffer layer may be formed at a temperature of 400° C. to 1500° C. and a pressure of about 10 torr to 780 torr.

According to the present invention, lattice mismatch between a substrate and a GaN-based semiconductor layer can be reduced due to an AlxGa1-xN ($0 \le x \le 1$) buffer layer having the composition ratio x of Al decreasing from the substrate to the GaN-based semiconductor layer, thereby lowering a defect density of a light emitting diode.

Further, according to present invention, an AlN layer is formed on the substrate, the AlxGa1-xN ($0 \le x \le 1$) buffer layer having the gradually decreasing composition ratio x of Al is grown on the AlN layer, and the GaN-based semiconductor layer is then formed, so that the GaN-based semiconductor layer having a desirable surface configuration and electrical properties.

DETAILED DESCRIPTION OF THE ILLUSTRATED EMBODIMENTS

Hereinafter, preferred embodiments of the present invention will be described in detail with reference to the accompanying drawings.

Figure 1:
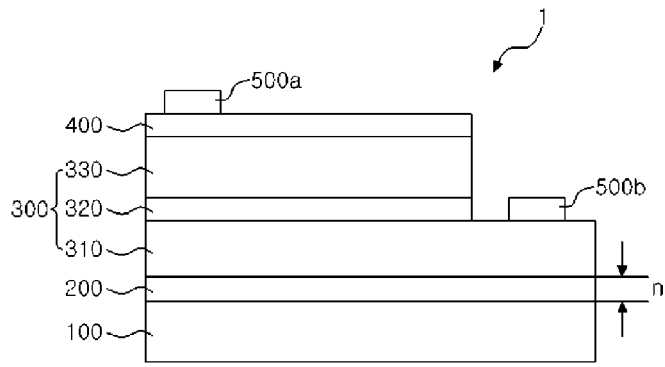
FIG. 1 is a sectional view of a light emitting diode according to an embodiment of the present invention.

FIG. 1 is a sectional view of a light emitting diode according to an embodiment of the present invention.

Referring to FIG. 1, the light emitting diode 1 according to the embodiment of the present invention includes a sapphire substrate 100, an AlxGa1-xN ($0 \leq x \leq 1$) buffer layer 200, a first conductive semiconductor layer 310, an active layer 320, a second conductive semiconductor layer 330, a transparent electrode 400, and electrode pads 500a and 500b.

The sapphire substrate 100 is made of sapphire with good stability, and the AlxGa1-xN buffer layer 200 is formed on the sapphire substrate 100. The AlxGa1-xN ($0 \leq x \leq 1$) buffer layer 200 is interposed between the sapphire substrate and the first conductive semiconductor layer 310 (e.g., a GaN-based semiconductor layer or the like). The composition ratio x of Al decreases from the sapphire substrate 100 to the first conductive semiconductor layer 310.

Generally, a buffer layer for reducing lattice mismatch between the sapphire substrate 100 and the first conductive semiconductor layer 310 is interposed between the sapphire substrate 100 and the first conductive semiconductor layer 310. A GaN buffer layer or an AlN buffer layer is generally used as the buffer layer.

However, in case of the GaN buffer layer, there is a problem in that it is difficult to grow the GaN buffer into a single crystal on the sapphire substrate 100 due to a difference in lattice constant between the GaN buffer layer and the sapphire substrate 100. Particularly, since the GaN buffer layer grown on the sapphire substrate 100 has a higher defect density, the first conductive semiconductor layer 310 grown on the GaN buffer layer has deteriorated crystallinity, surface properties and electrical properties.

On the other hand, in case of the AlN buffer layer, the first conductive semiconductor layer 310 grown on the AlN buffer layer has a higher defect density due to a difference in lattice constant between the first conductive semiconductor layer 310 and the AlN buffer layer.

In order to solve the problems, the AlxGa1-xN buffer layer 200 having the composition ratio x of Al decreasing from the sapphire substrate 100 to the first conductive semiconductor layer 310 is used so that the first conductive semiconductor layer 310 can be grown to have improved crystallinity, surface properties and electrical properties.

In the AlxGa1-xN buffer layer 200, a portion of the AlxGa1-xN buffer layer 200 which is in contact with the sapphire substrate 100 has the composition ratio x of Al equal to 1, whereas another portion of $Al_xGa_{1-x}N$ buffer layer 200 which is in contact with the first conductive semiconductor layer 310 has the composition ratio x of Al equal to 0, so that the GaN-based, first conductive semiconductor layer 310 can be grown to have a lower defect density and improved crystallinity, surface properties and electrical properties.

Figure 2:
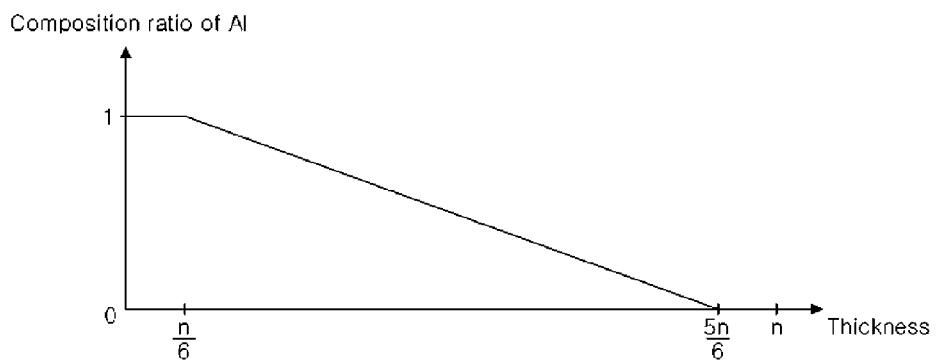
FIG. 2 is a graph showing a composition ratio of Al in an AlxGa1-xN buffer layer to the thickness thereof according to an embodiment of the present invention.
Figure 3:
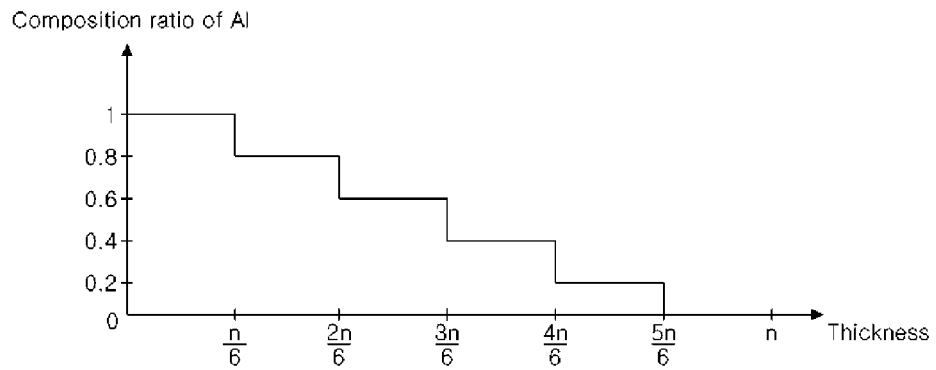
FIG. 3 is a graph showing a composition ratio of Al in an AlxGa1-xN buffer layer to the thickness thereof according to another embodiment of the present invention.
Figure 4:
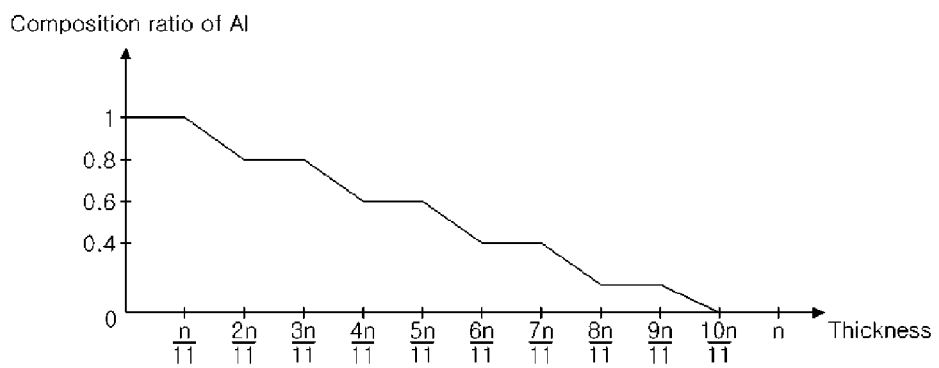
FIG. 4 is a graph showing a composition ratio of Al in an AlxGa1-xN buffer layer to the thickness thereof according to a further embodiment of the present invention.

The composition ratio x of Al in the AlxGa1-xN buffer layer 200 may decrease in a linear manner as shown in FIG. 2; step by step, i.e., in a stepwise manner as shown in FIG. 3; or in a declined stepwise manner as shown in FIG. 4. If the composition ratio of Al decreases in the stepwise manner, the composition ratio x may decrease sequentially to 1, 0.8, 0.6, 0.4, 0.2 and 0.

For example, the portion of the AlxGa1-xN buffer layer 200 having the composition ratio x equal to 1, i.e., the AlN buffer layer, may have a thickness of about 1 nm to about 50 nm. The other portion of the AlxGa1-xN buffer layer 200 having the composition ratio x equal to 0, i.e., the GaN buffer layer, may have a thickness of about 1 nm to about 50 nm. If the composition ratio x of the AlxGa1-xN buffer layer 200 decreases in the stepwise manner or in the declined stepwise manner, each of portions of the AlxGa1-xN buffer layer 200 having a constant composition ratio x other than 1 and 0 may have, for example, a thickness of about 1 nm to about 30 nm, preferably about 20 nm to about 30 nm.

The AlxGa1-xN buffer layer 200 may be formed by using metal organic chemical vapor deposition (MOCVD), hydride vapor phase epitaxy (HVPE), molecular beam epitaxy (MBE) or the like. The AlxGa1-xN buffer layer 200 may be formed by using any one of the crystal epitaxial growth processes described above, for example, at a temperature of 400° C. to 1500° C. and a pressure of about 10 torr to about 780 torr.

The first conductive semiconductor layer 310 may be formed of an N-type AlxInyGa1-x-yN ($0 \leq x, y, x+y \leq 1$) layer and may include an N-type clad layer. The first conductive semiconductor layer 310 may be formed by doping silicone Si.

The active layer 320 is a region where electrons and holes are recombined, and contains InGaN. The wavelength of light emitted from the light emitting diode 1 depends on the material forming the active layer 320. The active layer 320 may be a multi-layered film in which quantum well layers and barrier layers are formed repeatedly. The quantum well layers and the barrier layers may be binary to quaternary compound semiconductor layers which may be represented by the general formula AlxInyGa1-x-yN ($0 \leq x, y, x+y \leq 1$).

The second conductive semiconductor layer 330 may be made of P-type AlxInyGa1-x-yN ($0 \leq x, y, x+y \leq 1$), and may include a P-type clad layer. The second conductive semiconductor layer 330 can be formed by doping zinc Zn or magnesium Mg.

The light emitting diode 1 has a structure in which the first conductive semiconductor layer 310, the active layer 320, and the second conductive semiconductor layer 330 are continuously laminated. The active layer 320 is formed on a portion of the first conductive semiconductor layer 310, and the second conductive semiconductor layer 330 is formed on the active layer 320. Accordingly, a portion of a top surface of the first conductive semiconductor layer 310 abuts to the active layer 320, and the remaining portion of the top surface of the first conductive semiconductor layer 310 is exposed to the outside.

The transparent electrode 400 is formed on the second conductive semiconductor layer 330. The transparent electrode 400 is in the form of a plate and allows the light emitted from the active layer 320 to be transmitted therethrough to the outside. The transparent electrode 400 may be made of a transparent material such as Ni/Au or indium tin oxide (ITO). The transparent electrode 400 allows a current received through the electrode pad 500a to be evenly distributed, thereby functioning to improve luminous efficiency.

The electrode pads 500a and 500b are formed on the transparent electrode 400 and the first conductive semiconductor layer 310, respectively. The electrode pads 500a and 500b are connected to leads (not shown) by wires so as to receive power from an external power supply.

Figure 5:
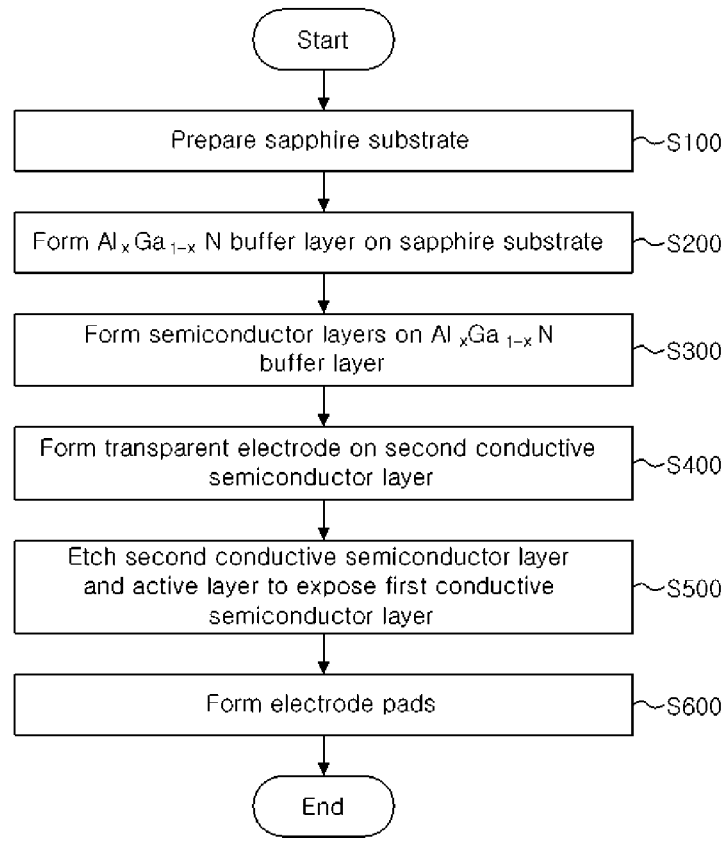
FIG. 5 is a flowchart illustrating a method of fabricating a light emitting diode according to an embodiment of the present invention.
Figure 6:
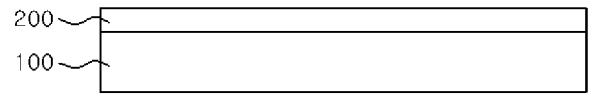
FIGS. 6 and 7 are sectional views illustrating the method of fabricating a light emitting diode according to the embodiment of the present invention.
Figure 7:
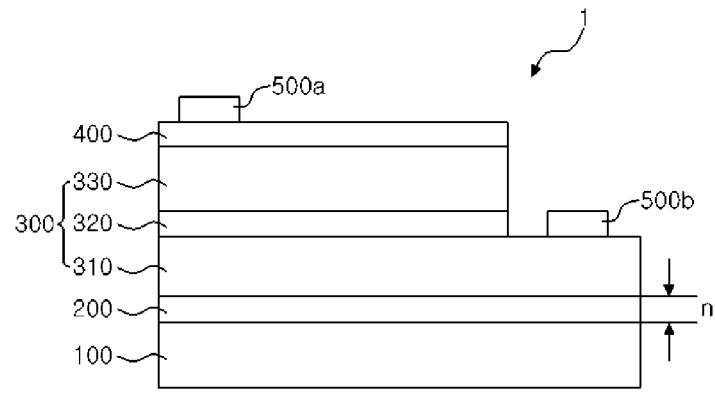

FIG. 5 is a flowchart illustrating a method of fabricating a light emitting diode according to an embodiment of the present invention, and FIGS. 6 and 7 are sectional views illustrating the method of fabricating a light emitting diode according to the embodiment of the present invention.

Referring to FIGS. 5 and 6, the sapphire substrate 100 is prepared (S100). However, another kind of substrate such as a spinel substrate, a Si substrate or a SiC substrate other than the sapphire substrate may be used to implement the present invention.

Then, the AlxGa1-xN (0≤x≤1) buffer layer 200 having the composition ratio x of Al decreasing from the sapphire substrate 100 to the first conductive semiconductor layer 310 is formed (S200).

The AlxGa1-xN buffer layer 200 may be formed by using metal organic chemical vapor deposition (MOCVD), hydride vapor phase epitaxy (HVPE), molecular beam epitaxy (MBE) or the like. The AlxGa1-xN buffer layer 200 may be formed by using any one of the crystal epitaxial growth processes described above, for example, at a temperature of 400° C. to 1500° C. and a pressure of about 10 torr to about 780 torr.

The thickness of the AlxGa1-xN buffer layer 200 and the composition ratio x of Al have been described in detail with reference to FIGS. 1 and 2.

Referring to FIGS. 5 and 7, after the AlxGa1-xN buffer layer 200 is formed, the semiconductor layers 300, i.e., the first conductive semiconductor layer 310, the active layer 320, and the second conductive semiconductor layer 330, are sequentially formed on the AlxGa1-xN buffer layer 200 (S300).

The semiconductor layers 300 may be formed by using the metal organic chemical vapor deposition (MOCVD), the hydride vapor phase epitaxy (HVPE), the molecular beam epitaxy (MBE) or the like. Further, the semiconductor layers 300 may be continuously formed in the same processing chamber.

After the semiconductor layers 300 are formed, the transparent electrode 400 is formed on the second conductive semiconductor layer 330 (S400).

After the transparent electrode 400 is formed, the second conductive semiconductor layer 330 and the active layer 320 are patterned or etched by using a photolithographic or etching process, to expose a portion of the top surface of the first conductive semiconductor layer 310 (S500).

Then, the electrode pad 500b is formed on the exposed portion of the first conductive semiconductor layer 310, and the electrode pad 500a is formed on the transparent electrode 400 (S600), thereby completing the fabrication process. The electrode pads 500a and 500b may be formed by using a liftoff method.

Although the embodiment of the present invention has been described mainly in connection with the sapphire substrate, it will be apparent that another kind of substrate such as a spinel substrate, a Si substrate or a SiC substrate may be used instead of the sapphire substrate.

The present invention is not limited to the embodiments described above. Those skilled in the art can make various modifications and changes thereto, and the modifications and changes embodiments fall within the scope and sprit of the present invention defined by the appended claims.

The invention claimed is:

1. A light emitting diode, comprising:
a substrate;
a first conductive semiconductor layer comprising an N-type $Al_zIn_yGa_{1-z-y}N$ (0≤z,y,z+y≤1) layer positioned on the substrate; and
an $Al_xGa_{1-x}N$ (0≤x≤1) buffer layer interposed between the substrate and the first conductive semiconductor layer and comprising a first region having a composition ratio x of Al decreasing from the substrate to the first conductive semiconductor layer and a second region of the $Al_xGa_{1-x}N$ buffer layer having the composition ratio of Al equal to 1,
wherein the second region contacts the first region and the substrate,
wherein the second region has a thickness of about 1 nm to about 50 nm,
wherein the first conductive semiconductor layer contacts the $Al_xGa_{1-x}N$ buffer layer, and
wherein the degree of lattice mismatch between the substrate and the second region of the $Al_xGa_{1-x}N$ buffer layer is smaller than the degree of lattice mismatch between the substrate and the first conductive semiconductor layer.

2. The light emitting diode as claimed in claim 1, wherein the composition ratio of Al decreases in a linear manner.

3. The light emitting diode as claimed in claim 2, further comprising a third region of the $Al_xGa_{1-x}N$ buffer layer having the composition ratio of Al equal to 0.

4. The light emitting diode as claimed in claim 3, wherein the third region has a thickness of about 1 nm to about 50 nm.

5. The light emitting diode as claimed in claim 3, wherein the third region is disposed between the first conductive semiconductor layer and the first region.

6. The light emitting diode as claim in claim 3, wherein the first conductive semiconductor layer contacts the third region.

7. The light emitting diode as claimed in claim 2, wherein the first region has a thickness of about 1 nm to about 30 nm.

8. The light emitting diode as claim in claim 1, wherein the second region is disposed between the substrate and the first region.

9. A method of fabricating a light emitting diode, comprising:
preparing a substrate;
forming an $Al_xGa_{1-x}N$ (0≤x≤1) buffer layer directly on the substrate, the buffer layer having a composition ratio of Al decreasing away from a surface of the substrate; and
forming a GaN-based semiconductor layer comprising an N-type $Al_zIn_yGa_{1-z-y}N$ (0≤z,y,z+y≤1) layer on the $Al_xGa_{1-x}N$ buffer layer,
wherein $Al_xGa_{1-x}N$ (0≤x≤1) buffer layer comprises a first region having a composition ratio x of Al decreasing from the substrate to the GaN-based semiconductor layer and a second region of the $Al_xGa_{1-x}N$ buffer layer having the composition ratio of Al equal to 1,
wherein the second region contacts the first region and the substrate,
wherein the second region has a thickness of about 1 nm to about 50 nm,
wherein the GaN-based semiconductor layer contacts the $Al_xGa_{1-x}N$ buffer layer, and wherein the degree of lattice mismatch between the substrate and the second region of the $Al_xGa_{1-x}N$ buffer layer is smaller than the degree of lattice mismatch between the substrate and the first conductive semiconductor layer.

10. The method as claimed in claim 9, wherein the composition of Al decreases in a linear manner.

* * * * *